United States Patent
Bravo et al.

(10) Patent No.: US 7,181,659 B2
(45) Date of Patent: Feb. 20, 2007

(54) MEMORY BUILT-IN SELF TEST ENGINE APPARATUS AND METHOD WITH TRIGGER ON FAILURE AND MULTIPLE PATTERNS PER LOAD CAPABILITY

(75) Inventors: Elianne A. Bravo, Wappingers Falls, NY (US); Kenneth Y. Chan, Hopewell Junction, NY (US); Kevin C. Gower, LaGrangeville, NY (US); Dustin J. VanStee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 11/055,195

(22) Filed: Feb. 10, 2005

(65) Prior Publication Data

US 2006/0179369 A1    Aug. 10, 2006

(51) Int. Cl.
*G11C 29/00* (2006.01)
(52) U.S. Cl. .................................. 714/718; 714/733
(58) Field of Classification Search ................ 714/733, 714/42, 744, 718; 702/119; 711/100
See application file for complete search history.

(56) References Cited

U.S. PATENT DOCUMENTS

| | | | |
|---|---|---|---|
| 6,553,527 B1 * | 4/2003 | Shephard, III | 714/733 |
| 6,834,361 B2 * | 12/2004 | Abbott | 714/42 |
| 7,036,064 B1 * | 4/2006 | Kebichi et al. | 714/744 |
| 7,039,545 B2 * | 5/2006 | Bundy et al. | 702/119 |
| 7,114,024 B2 * | 9/2006 | Herbst | 711/100 |

\* cited by examiner

*Primary Examiner*—David Ton
(74) *Attorney, Agent, or Firm*—Cantor Colburn LLP

(57) ABSTRACT

A memory built-in self test (MBIST) apparatus and method for testing dynamic random access memory (DRAM) arrays, the DRAM arrays in communication with a memory interface device that includes interface logic and mainline chip logic. The MBIST apparatus includes a finite state machine including a command generator and logic for incrementing data and addresses under test and a command scheduler in communication with the finite state machine. The command scheduler includes resource allocation logic for spacing commands to memory dynamically utilizing DRAM timing parameters. The MBIST apparatus also includes a test memory storing subtests of an MBIST test. Each of the subtests provides a full pass through a configured address range. The MBIST apparatus further includes a subtest pointer in communication with the test memory and the finite state machine. The finite state machine implements subtest sequencing of each of the subtests via the subtest pointer.

13 Claims, 4 Drawing Sheets

MEMORY BUILT-IN SELF TEST ENGINE APPARATUS AND METHOD WITH TRIGGER ON FAILURE AND MULTIPLE PATTERNS PER LOAD CAPABILITY

BACKGROUND OF THE INVENTION

1. Field of the Invention

This invention relates to memory test engines for dynamic random access memories, and particularly to a memory built-in self test apparatus and method with a trigger on failure and multiple patterns per load capability.

2. Description of Background

As chips become faster in frequency, there is a greater need for hardware to include self test logic that can validate internal logic, interconnects, and externally connected arrays of memory during all phases of the lifetime of a product. In the past, this testing has been performed by very expensive high-speed test equipment that requires a great deal of special test programs be written. Oftentimes when a fail occurs, the failing component is re-tested on a tester, and sometimes the fail is not able to be found due to the nature of the test programs (i.e., the way in which commands are sent). The cost of using high speed test equipment can be offset by designing self test logic into the chip.

The design of memory built in self test (MBIST) logic solves the problem of determining whether or not an array of memory connected to an interface chip is functional or not and may further help to isolate the failure to locations in the memory array. However, while the MBIST resolves some problems, other issues are left unresolved, such as, for example, capabilities for generating a memory controller type command stream to the memory array, reducing the number of times the MBIST engine must be configured per address load, creating a signal that external test equipment can use to trigger on a fail, testing a memory array with more than one address port, varying chip configurations dynamically during an MBIST run to generate AC pass/fail data, snooping a command stream to detect resource faults, and detecting address failures when reading back data with ECC encoded.

SUMMARY OF THE INVENTION

The shortcomings of the prior art are overcome and additional advantages are provided through the provision of a memory built-in self test (MBIST) apparatus and method for testing dynamic random access memory (DRAM) arrays, the DRAM arrays in communication with a memory interface device that includes interface logic and mainline chip logic. The MBIST apparatus includes a finite state machine including a command generator and logic for incrementing data and addresses under test and a command scheduler in communication with the finite state machine. The command scheduler includes resource allocation logic for spacing commands to memory dynamically utilizing DRAM timing parameters. The MBIST apparatus also includes a test memory storing subtests of an MBIST test. Each of the subtests provides a full pass through a configured address range. The MBIST apparatus further includes a subtest pointer in communication with the test memory and the finite state machine. The finite state machine implements subtest sequencing of each of the subtests via the subtest pointer.

Method and computer program products corresponding to the above-summarized apparatus are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

In accordance with exemplary embodiments, an MBIST apparatus and method are provided. The MBIST apparatus is used to test DRAM arrays connected to a memory interface device (MID), e.g., a NOVA chip. The MBIST apparatus generates write and read commands through configured address ranges with configured data patterns to test the DRAM array for fails. The generated commands and data are then multiplexed into a mainline chip command and data flow. The MBIST engine is structured to find memory coupling faults, as well as faults generated from very high data bus utilization. Refreshes may also be performed by the MBIST apparatus to maintain stable array data throughout the passes through the DRAM array address range. The MBIST apparatus uses a dynamic scheduling algorithm to space commands to memory.

Figure 1:
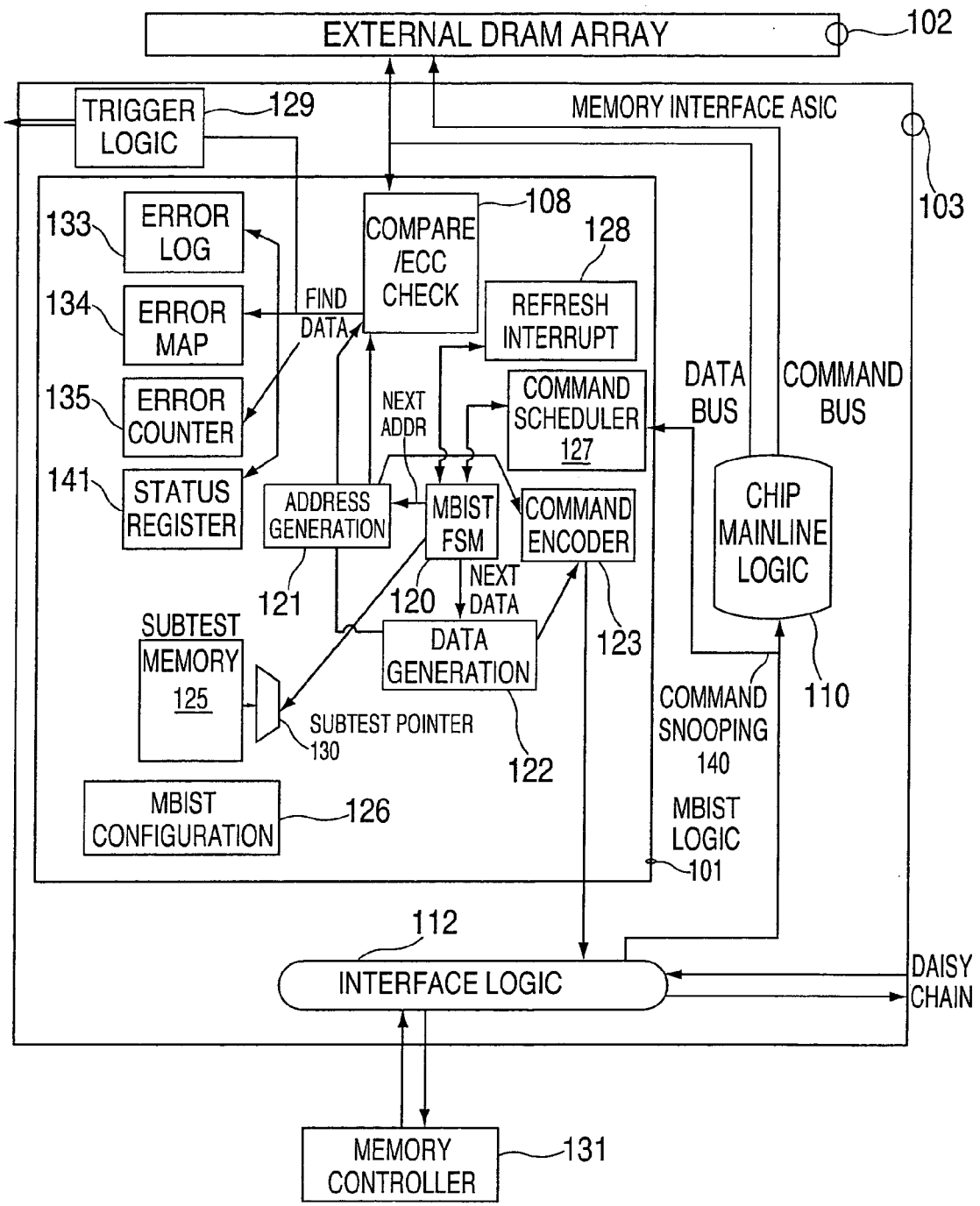
FIG. 1 is a diagram of a system upon which MBIST apparatus elements may be implemented in exemplary embodiments.

Turning now to FIG. 1, a diagram of a system upon which the MBIST apparatus may be implemented will now be described. The system of FIG. 1 includes a memory interface device (MID) 103 and DRAMs 102. MID 103 includes the MBIST apparatus 101 for testing the functionality of the DRAMs 102 connected to the MID 103. The MBIST apparatus 101 generates write and read commands through configured address ranges with configured data patterns to test the DRAM array 102 for fails detectable via fail logic 108. An address generator 121 provides logic that creates the address ranges. Likewise, a data generator 122 provides logic that creates the data pattern. The fail logic 108 is used to compare expected data versus received data, or when in error correcting (ECC) data mode, checks for correct ECC from the memory array. The commands and data are then multiplexed into the chip interface logic 112 via a command encoder 123 and sent to the mainline chip command and data flow 110.

The MBIST apparatus 101 includes an MBIST finite state machine (FSM) 120 that provides logic for controlling the command sequencing, data/address incrementing, refresh interrupts, and subtest pointer increments. Further, the MBIST FSM 120 implements Entry/Exit logic for handling self-timed refresh in an automated manner. Also, the MBIST FSM 120 includes a command generator that allows for detection of couple faults or noise faults. Command resource allocation logic is provided via a command scheduler 127 and is also included in the MBIST apparatus 101 for removing command overlaps and optimizing command spacing to memory. This is described further herein. Additionally, the MBIST apparatus 101 contains a test memory 125 for storing subtests. Each subtest contains information about the subtest type, subcommand complement, address mode, data mode, and done bit. These elements allow for multiple passes through memory without a need to reload registers, as described further herein. The MBIST apparatus 101 further implements: Refresh interrupt logic 128, Stop on Error after subtest completed (configurable), Break after subtest completed (configurable), and Trigger on Fail logic 129. These implementations are described further herein.

A single subtest refers to a full march through a configured address range. The MBIST apparatus 101 allows for multiple subtests during a single MBIST test of the memory array. Any number of subtests may be configured to run in a single MBIST test. The MBIST FSM 120 controls the sequencing of the MBIST subtests by incrementing the subtest pointer 130 when a subtest is completed.

Some subtests support more than one memory read/write combination per address. Each command per address is called a subcommand. For example, during a read—write—write subtest, each address will receive a read, write, write command sequence before the MBIST FSM 120 increments the address. Each subcommand has an associated data pattern, and this pattern may be programmed to be complemented via the subtest memory 125. This allows for marches through memory that can detect coupling faults.

An added looping mechanism provided by the MBIST FSM 120 enables a user to program infinite subtest loops. This feature may be used for burn in tests, as well as failure debug tests.

Other elements illustrated in the system of FIG. 1 are described further herein.

Figure 2:
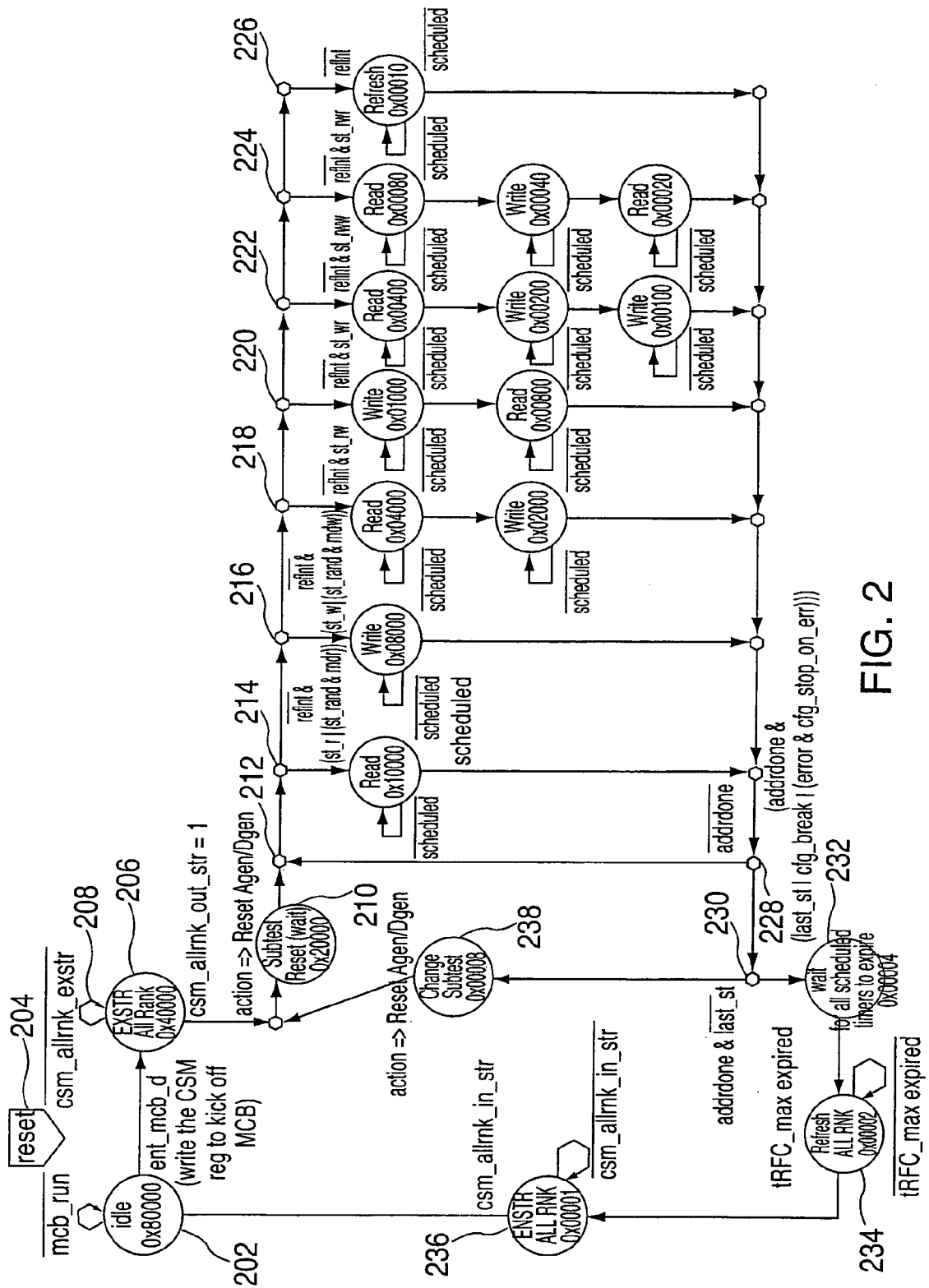
FIG. 2 is a diagram illustrating a finite state machine implementation of the MBIST apparatus in exemplary embodiments.

Turning now to FIG. 2, a sample MBIST finite state machine implementation in accordance with exemplary embodiments will now be described. The MBIST apparatus 101 is initialized to state 0x80000 (202). When a start command (204) is issued, the MBIST FSM 120 checks to see if the memory array 102 is in self timed refresh mode. If it is, then the exit self timed refresh command (206) is issued, and the FSM 120 waits an appropriate amount of time (208) before jumping to the next state (i.e., the subtest reset state 0x20000 (210)).

If the memory array 102 is not in self timed refresh mode, the FSM 120 automatically skips to the subtest reset state 0x20000 (210). From this subtest reset state 0x20000 (210), the FSM 120 resets the address and data generators, 121 and 122, respectively, (212), and checks the current subtest. The FSM 120 then jumps to one of subtest type branches (214–224), depending on which subtest is being run. Branch (226) refers to the refresh interrupt state.

Upon exiting the branches (214–224), the address is incremented (228) and checked to make sure it is not the last address of the current subtest (230). If the address is not the last address, then the next command is issued by going back to branches (214–224), depending upon the current subtest.

If the last address has been detected and the current subtest is the last subtest (230), the FSM 120 exits by waiting for all current resource timers to timeout 0x00004 (232), refreshing all the active ranks 0x00002 (234), and then issuing an enter self timed refresh command 0x0000 (236). If the last address has been detected (230), and the current subtest is not the last subtest, then the FSM 120 increments the subtest pointer 130 (238), and moves to the next subtest type (e.g., one of subtest types 214–224), and begins issuing memory commands for the next subtest.

Subtest types enabled by the MBIST apparatus 101 are defined, but not limited to, the types described below and are used during run-time. The options in parentheses refer to dynamic variables. Configurations are static.

W(addr mode, data mode)—Write a background pattern to memory

R(addr mode, data mode)—Read a background pattern from memory

RW(addr mode, data mode)—Read a background pattern from memory, Write

WR(addr mode, data mode)—Write a background pattern to memory, Read

RWR (addr mode, data mode)—Read a background pattern from memory, Write Complement, Read memory RWW (addr mode, data mode)—Read a background pattern from memory, Write, Write Random Command (addr mode, data mode)

To use Random Command mode, a data background with ECC is written in advance. The data mode is programmed to be random data with ECC. An LFSR may be used to create the random read/write commands, with a configurable weighting distribution. It will be understood that each subcommand in a subtest will have the programmable setting of reading/writing the complement of the defined data phase.

In addition, another outer loop to an MBIST test may be specified where chip configurations (e.g., MBIST configuration 126 of FIG. 1) are altered after each pass through a full MBIST test run, thus, allowing a user to vary one or more configurations and re-test the memory array 102. This outer loop may be built into hardware or software. In the software, a specific set of chip configurations may be tested by changing the chip configuration, and then re-running the MBIST test. When the MBIST test finishes, the software checks to see if the current MBIST test at a specific configuration passed or failed. A pass/fail plot may be drawn for each variable that is being changed during the outer loop. A hardware implementation may include logic that does the similar operations within the configuration chip 126.

Figure 3:
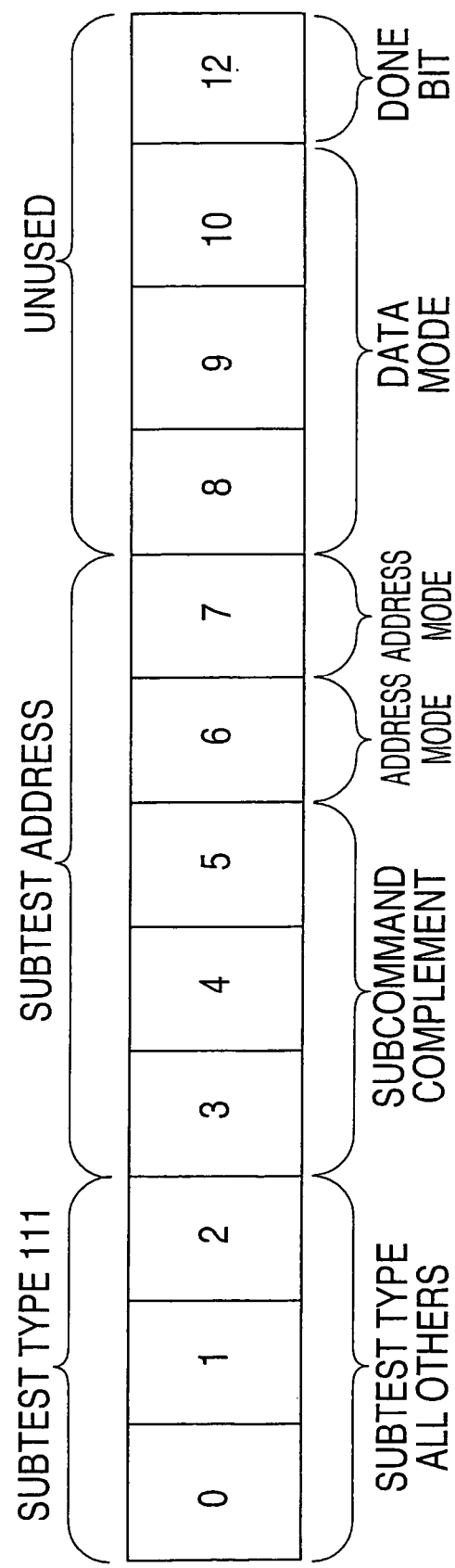
FIG. 3 illustrates a format of an entry in a memory array that is programmable by the MBIST apparatus in exemplary embodiments.

Turning now to FIG. 3, a format of an entry in a subtest memory array 125 that is programmable by the MBIST apparatus 101 will now be described in accordance with exemplary embodiments. The MBIST apparatus 101 may support multiple subtests to be run in succession. In accordance with one embodiment, each entry in the memory array 125 is programmed using the following subtest definition.

Subtest Type—0:2b
000—Write W
001—Read R
010—Read/Write RW
011—Write/Read WR
100—Read/Write/Read RWR
101—Read/Write/Write RWW
110—Random Command Sequence
111—Goto Subtest N (add a pointer field to address N)
If Subtest(0:2)=111 (goto command), then
Subtest Addr—3:7 specifies which subtest address to change to (used for looping).

Unused—8:11

For all other decodes of Subtest Type(0:2) the following table is used.

Subcommand Complement—3:5
(3)—Complement the data for the first subcommand
(4)—Complement the data for the second subcommand
(5)—Complement the data for the third subcommand
Address Mode—6
0—Sequential
1—Random
Address Mode—7
0—Forward
1—Reverse
Data Mode—8:10
000—Fixed
001—Random Forward
01—Random w/ECC Forward
101—Data equals Address
110—Data Rotate Left
111—Data Rotate Right
Done bit—11
0—MBIST test will not finish after current subtest, continue on to next subtest
1—MBIST test will complete after current subtest has been executed As indicated above in FIG. 1, the MBIST FSM 120 of the MBIST apparatus 101 includes entry/exit logic for handling automated self-timed refreshes. Sample entry/exit logic features may include:

Start, Fail, In Progress, and Done information can be read out of the MID chip 103 during runtime.

The MBIST apparatus 101 automatically takes the DRAM 102 out of STR state if it is currently in that state.

Break after subtest is supported. A user may interrupt the MBIST apparatus 101 while it is in loop mode, and the MBIST apparatus 101 will exit after the current subtest has completed.

Stop on Error after subtest completed is supported by the MBIST apparatus 101. If a user sets this bit before issuing the command to kickoff the MBIST testing, then when an error is detected the MBIST FSM 120 will exit after the current subtest is completed.

Refreshes may be generated every refresh interval (refInt) via a configurable interrupt timer component of the refresh interrupt logic 128. Refreshes to each rank may also be enabled and disabled via a configuration register (e.g., MBIST configuration 126). In exemplary embodiments, refreshes are sent out only after the completion of all commands to a particular address, and the rank is then reserved for a time of tRFC before new read and write commands are sent to the particular rank.

Refresh features may include the following:

Interrupt driven refresh with programmable cycle count from 0 to 7.8 us

Immediate refresh to all ranks upon startup of MBIST engine

Staggered rank refresh—example of an 8 rank implementation but not limited to 8 ranks Rank0 refreshed after 0.25* refInt, then refreshed at refInt thereafter Rank1 refreshed after 0.50* refInt, then refreshed at refInt thereafter Rank2 refreshed after 0.75* refInt, then refreshed at refInt thereafter Rank3 refreshed after 1.0* refInt, then refreshed at refInt thereafter Rank4 refreshed after 0.12* refInt, then refreshed at refInt thereafter Rank5 refreshed after 0.37* refInt, then refreshed at refInt thereafter Rank6 refreshed after 0.62* refInt, then refreshed at refInt thereafter Rank7 refreshed after 0.87* refInt, then refreshed at refInt thereafter Final refresh of all ranks is performed upon exit As indicated above, the MBIST apparatus 101 provides resource scheduling. Dynamic command scheduling controls the command spacing due to changing memory address location. The command scheduler 127 ensures that the command will not violate timing parameters of the DRAM 102. If a command does not fit for the current cycle due to a busy resource, then the command may be held until the next cycle and rechecked to see if it is valid. A minimum command gap parameter may also be programmable, such that all commands are spaced greater than the minimum gap. This may be useful for debug and throttling the command generator of the FSM 120 in slowing command generation rates. To achieve the highest command generation rate, the addressing may be set such that the address does not access the same bank when the address is incremented.

The dynamic resource scheduling of the MBIST apparatus 101 provides an accurate model of the stresses a memory controller 131 may put on a DRAM 102. Timings between commands are subject to DRAM timing parameters and resource allocation constraints. Also, commands will not be reordered with respect to when the bank activate command is sent out to memory array 102. In addition, data is not reordered. If a command occurs, the next command in the stream will not utilize the data bus until the previous command lets go of the data bus.

By way of illustration, the following resources may be managed by the MBIST apparatus 101. The number of resources may change depending upon the application and memory interface topology. It will be understood by those skilled in the art that any number and type of resource may be utilized. The following listing is for illustrative purposes and is not to be construed as limiting in scope.

Ranks
Banks
Data bus
Command busses
Data bus turnaround resources
Four Bank Activate Window (tFAW) resources
Minimum Command Gap resource Resource scheduling of resources (e.g., rank, bank, data bus, etc.) will now be described. To schedule a resource, the MBIST command scheduler 127 uses counters and shift registers. When a new command is ready to be sent, the command scheduler 127 checks to see if the resources for that current command are free. The resources to be used depend upon the command type (read, write, refresh), and the address. To determine if a command can be sent, all the resources that are necessary for the current command must be free. Each resource has special requirements for determining if they are free.

During normal functional chip operation, the command scheduler 127 may be put in a mode to snoop the incoming command stream 140 and schedule the commands into the resource scheduler of the MBIST FSM 120. The resource scheduler detects if commands from the memory controller 131 are sent with non-legal timings. In this mode, the command scheduler 127 raises an error condition if there is an illegal use of any resource (e.g., rank, bank, data bus, etc).

The MBIST apparatus 101 internally generates commands in the same format as commands that are sent to the MID chip 103 via the memory controller 131 to interface logic 112. Commands supported by the MBIST apparatus 101 may include: Bank activate with column read; Bank activate with column write; Write to Buffer; Refresh; Self Refresh; and Idle.

There are four addressing modes supported by the MBIST apparatus 101: Sequential forward and reverse, and random forward and reverse. For sequential/random addressing, a starting and ending may be configured. In one MBIST test run, random address and sequential address tests may be performed. During reverse address sequences, the address generator starts from the end address and decrements to the start address, at which time the current subtest ends, and the MBIST engine 101 jumps to the next subtest. For random addressing, the user may define a fixed address width and select a configurable LFSR mask such that random patterns can be generated for different sized address ranges.

Address Generation Supports are also enabled by the MBIST apparatus 101. Address generation supports may include: Special two port address generation logic (121) for different sized DIMM's connected to multiple address ports; and Sequential forward, sequential reverse, random forward, random reverse addressing modes. Additionally, each address range may have its own LFSR and a configurable per bit mapping to specify which physical address maps onto Rank, Bank, RAS, and CAS, which allows for quick rank-rank, bank-bank, accesses to memory.

Further, in order to support alternating between different sized DIMMs, a system may be implemented that allows the user to specify a weighted random number or deterministic sequence to interleave between both DIMMs. If the end address for one DIMM is reached before the other DIMM, the following commands will only be issued to the DIMM which address has not finished its address space.

Address consists of:
Physical Address Busses
Rank
Bank
Row Address
Column Addresses Address generation supports further include:

Column bits 0-1, 0-2 are programmable, but fixed for a given test when BL=4, 8 respectively.

Sequential addressing with a starting address and ending address.

Random addressing with a starting address and ending address.

Creates a random address pattern of specified width starting from LSB to specified width. Specified width+1 to MSB can be configured to any value.

Address 0 will be generated at the end of a subtest for the randomly generated address portion.

Figure 4:
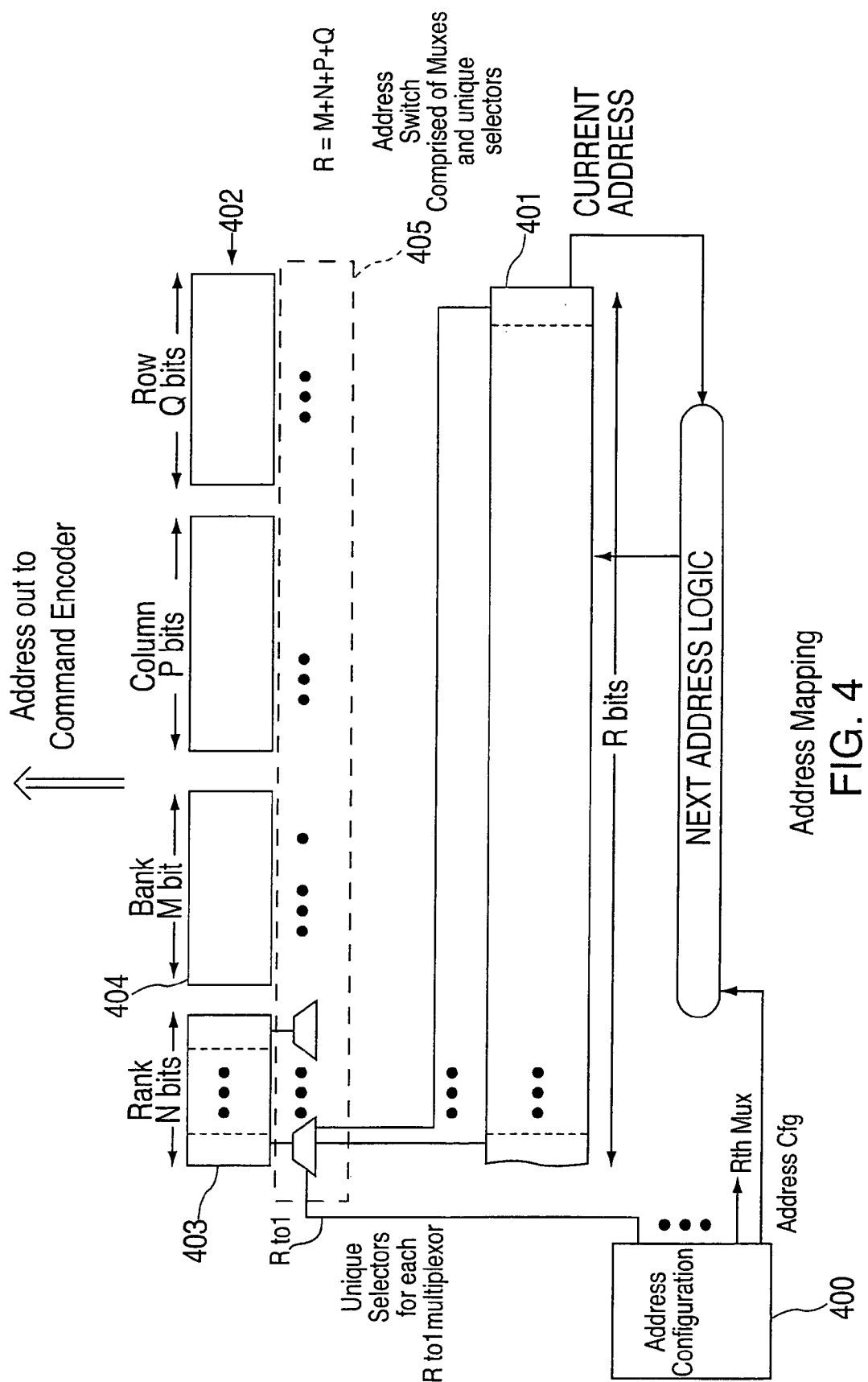
FIG. 4 is a diagram illustrating logic used for mapping addresses from a raw address to a logical address in exemplary embodiments.

Turning now to FIG. 4, logic used in mapping addresses from a raw address to a logical address in exemplary embodiments will now be described. A raw address register 401 is mapped to a logical address register 402 through an address switch 405 by setting up configuration registers 400. In random addressing mode, a fixed width setting LFSR mask and starting and ending address values must be configured 400. In exemplary embodiments, the user makes the active rank and bank bits, 403 and 404 respectively, to be the least significant bit (LSB) to send commands as quickly as possible to the DRAM array 102.

The data mode features that are supported by the MBIST apparatus 101 include the following:
Burst 8 or Burst 4 Fixed Data Pattern
Random Data (one LFSR per bit;)
Data=Address—Address is replicated in the data bus is larger than address bus. The last bits are used as a burst counter.

Random Data and Address with ECC—code allows for random data with address encoded in the check bits. This is useful for random command sequence mode; however, any command sequence mode is valid with this data mode.

Data Rotate Mode—a pattern is programmed into a register, during each burst the data pattern is rotated right or left by a configurable number of bits.

As indicated above, error report features are also provided by the MBIST apparatus 101. When a failure is detected via fail logic 108, the MBIST apparatus 101 includes three mechanisms that may be used to record the failure: a detailed error log 133, an error map 134, and byte lane error counters 135. A register array may be used to store the data when an error occurs. When an error occurs, the following information is stored in the error log 133.
Received Data
Expected Data
Address
Subtest Number
Read Command Number
Burst Number
Ability to store first N/last N fails The error map 134 refers to an array used in determining which DRAM(s) failed during an MBIST test. A user may reset the error log 133, error counters 135, and error map 134 and status register 141 after the full MBIST test is completed, e.g., by writing a configuration bit.

The Error Map 134 may comprise an array for tracking specific DRAM failure. Byte Lane Error Counters 135 count the number of fails that occurred on a byte lane.

Features of the Status Register 141 may include: CE Detected (ECC mode only); UE Detected (ECC mode only); Error trap Overflow 8 fails; and Current Subtest Pointer. In accordance with exemplary embodiment, the MBIST apparatus 101 will always complete even if a fail is detected, unless a stop on error configuration bit is set. If a fail occurs during MBIST operation, the trigger on fail logic 129 may be programmed to send an output pulse off chip to existing test equipment. This function allows test equipment such as network analyzers or oscilloscopes the ability to capture fail data on external chip to memory interconnects to debug fails.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A memory built-in self test (MBIST) apparatus for testing dynamic random access memory (DRAM) arrays, the DRAM arrays in communication with a memory interface device that includes interface logic and mainline chip logic, the MBIST apparatus including:
   a finite state machine including a command generator and logic for incrementing data and addresses under test;
   a command scheduler in communication with the finite state machine, the command scheduler including resource allocation logic for spacing commands to memory dynamically utilizing DRAM timing parameters;
   a test memory storing subtests of an MBIST test, each of the subtests providing a full pass through a configured address range and providing information including subtest type, subcommand complement, address mode, data mode, and done bit; and
   a subtest pointer in communication with the test memory and the finite state machine, wherein the finite state machine implements subtest sequencing of each of the subtests via the subtest pointer.

2. The MBIST apparatus of claim 1, wherein the command scheduler further comprises logic for:
   snooping an incoming command stream and scheduling commands in the command stream into a resource scheduler of the finite state machine, the resource scheduler detecting command sent from non-legal timings; and
   in response to the snooping and detecting, raising an error condition if an illegal use of a resource is determined.

3. The MBIST apparatus of claim 1, wherein the MBIST test includes a plurality of chip configurations alterable after each pass of the MBIST test, the plurality of alterable chip configurations operable for retesting memory.

4. The MBIST apparatus of claim 1, further comprising a trigger on fail signal generated by the finite state machine, the trigger on fail signal issued when an error is detected.

5. The MBIST apparatus of claim 1, wherein the subtest type includes one of:
   write;
   read;
   read/write;
   write/read;
   read/write/read;
   read/write/write;
   random command sequence; and
   goto subtest N.

6. The MBIST apparatus of claim 1, further comprising an address switch operable for allowing a raw N-bit address to be mapped to actual DRAM address bits in any order specified.

7. A method for implementing a memory built-in self test (MBIST) apparatus including a finite state machine for testing dynamic random access memory (DRAM) arrays, the DRAM arrays in communication with a memory interface device that includes interface logic and mainline chip logic, the method including:
   implementing a subtest comprising a full pass through a configured address range, the subtest type providing information including subtest type, subcommand complement, address mode, data mode, and done bit;
   implementing subtest sequencing of the subtest via a subtest pointer that is in communication with a test memory storing subtests and the finite state machine; and
   allocating resources for subtest commands including spacing commands to memory dynamically utilizing DRAM timing parameters.

8. The method of claim 7, wherein the allocating resources is performed by a command scheduler in communication with the finite state machine.

9. The method of claim 7, wherein the implementing a subtest further comprises:
   initializing the MBIST apparatus;
   in response to receiving a start command, performing one of:
      issuing an exit self timed refresh command if it is determined that the memory array is in self timed refresh mode and moving into a subtest reset state;
      automatically moving into the subtest reset state if it is determined that the memory array is not in self timed refresh mode;
   from the subtest reset state, resetting address and data generators and checking a current subtest;
   based upon the current subtest, jumping to one of a plurality of subtest type branches;
   incrementing corresponding addresses upon exiting the one of the plurality of subtest type branches; and
   issuing an other command by returning to another of the plurality of subtest type branches until a last address of the current subtest is reached.

10. The method of claim 9, further comprising:
    upon reaching the last address, incrementing a subtest pointer and moving to an other subtest type; wherein the incrementing a subtest pointer and moving to another subtest type is repeated until a last subtest has been determined.

11. The method of claim 10, further comprising:
    upon reaching the last subtest type, waiting for all current resource timers to time out, refreshing all active ranks, and issuing an enter self timed refresh command.

12. The method of claim 7, wherein the subtest type includes one of:
    write;
    read;
    read/write;
    write/read;
    read/write/read;
    read/write/write;
    random command sequence; and
    goto subtest N.

13. The method of claim 7, further comprising:
    mapping a raw N-bit address to DRAM address bits in any specified order via an address switch.

* * * * *